Aug. 11, 1959 W. P. HORTON 2,899,553
PULSE DELAY CIRCUIT
Filed Sept. 28, 1955

WILLIAM P. HORTON
INVENTOR.
BY Daniel I. Mayne
Lloyd F. Seebach
ATTORNEY & AGENT United States Patent Office 2,899,553

Patented Aug. 11, 1959

2,899,553

PULSE DELAY CIRCUIT

William P. Horton, Natick, Mass., assignor, by mesne assignments, to Eastman Kodak Company Application September 28, 1955, Serial No. 537,192

1 Claim. (Cl. 250—27)

Figure 1:
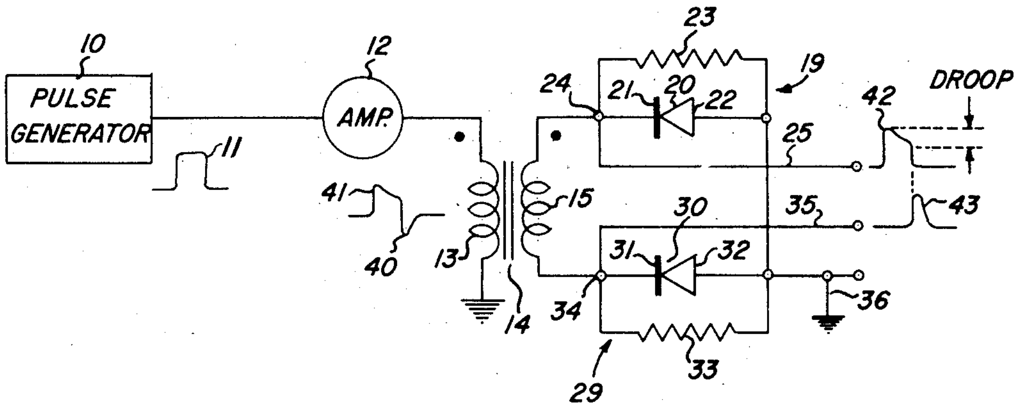

This invention relates to the production of delayed electrical pulses and more particularly to an arrangement in which two output pulses, one being delayed with respect to the other, are obtained from each input pulse.

While a delayed pulse output can be obtained in many ways, the circuits necessary to provide such a delayed pulse are for the most part quite complicated. In the present invention, however, means is provided whereby a delayed pulse output is available from a transformer-coupled amplifier without the use of electrical delay line and complex circuitry.

The primary object of the invention is, therefore, to provide an output pulse which is delayed with respect to the input pulse and which is of the same polarity.

Another object of the invention is to utilize a transformer-coupled amplifier and to utilize the energy stored in the transformer for obtaining a delayed output pulse.

Still another object of the invention is to utilize two electronic switching means in series circuit with the secondary winding of a transformer for delivering a non-delayed output pulse to one lead and a delayed output lead to a second lead, the delay being equivalent to the input pulse width.

And yet another object of the invention is to provide a regenerative action to the amplifier by buffering back to the amplifier input the non-delayed output pulse whereby the transformer driving pulse can be effectively widened and thereby increase the delay with respect to the second output pulse.

Other objects and advantages of the invention will be readily apparent to those skilled in the art from the description which follows:

According to the invention, the pulses delivered to the input of the amplifier can be either periodic or aperiodic pulses of either positive or negative polarity. Each pulse of current is then driven through the primary winding of a coupling transformer which, in turn, induces a pulse in the secondary winding. Two diodes are associated with the secondary winding, the cathode of one diode being connected to one side of the secondary winding and the cathode of the other diode being connected to the other side of the secondary winding. The anodes of the diodes are interconnected so that the diodes and the secondary winding are in series circuit. A resistor is connected across the anode and cathode of each diode, and an output lead is connected to each cathode. As a result of the transformer characteristics in combination with the value of one of the load resistors, a certain amount of energy is stored in the transformer which results in a droop in the wave form of the non-delayed output pulse. This results in an overshoot of current in the secondary winding to provide the delayed output pulse. The amplitude and shape of the delayed output pulse are then determined by the amount of energy stored in the transformer during the time the input pulse is applied and the time constant dictated by the transformer and the other load resistor, the delay being equivalent to the input pulse width. If the non-delayed output pulse is buffered back to the amplifier input, a regenerative action is obtained and the transformer driving pulse can be effectively widened.

Figure 2:
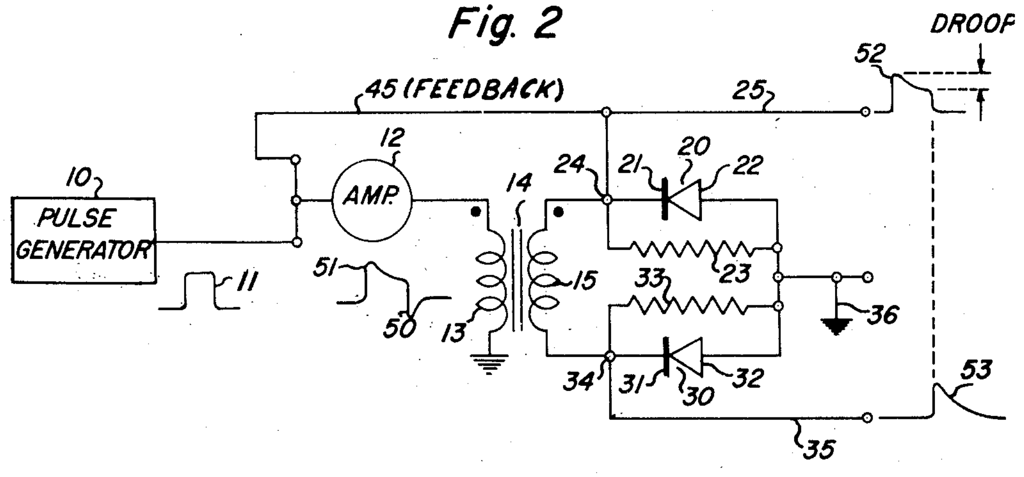

Reference is now made to the accompanying drawing wherein like reference numerals designate like parts and wherein:

Fig. 1 is a schematic circuit diagram of a preferred embodiment of the invention; and Fig. 2 is a schematic circuit diagram illustrating a specific feature of the invention.

Referring now to the drawing and more specifically to Fig. 1, one preferred embodiment of the invention is disclosed in which the numeral 10 designates a pulse generator which can be any device or apparatus producing either periodic or aperiodic pulses of substantially rectangular shape and of either polarity. Such a pulse pattern, as designated by the numeral 11, is indicative of the input pulse delivered to amplifier 12. The amplifier 12 can be a pentode or a triode amplifier, ½ type 5965, dual-triode, miniature, as disclosed in the example described hereinafter, or any other type of suitable amplifier. Amplifier 12 drives a pulse of current through the primary winding 13 of transformer 14 to ground and induces a pulse of current in the secondary winding 15 of the transformer, both the primary winding and the secondary winding being wound in the same direction.

Load circuit 19 comprises a diode 20 having a cathode 21, an anode 22, a resistor 23 connected across diode 20 and in parallel circuit therewith, and an output lead 25 connected at 24 to the cathode of diode 20. A second load circuit 29 comprises a diode 30 having a cathode 31, an anode 32, a resistor 33 connected across diode 30 and in parallel circuit therewith, and an output lead 35 connected at 34 to the cathoed of diode 30. From Fig. 1, it will be noted that cathode 21 is connected to one side of secondary winding 15, that cathode 31 is connected to the other side of secondary winding 15, and that anodes 22 and 32 are interconnected. As a result, secondary winding 15 and diodes 20 and 30 are connected in series circuit and connected to ground at 36.

At the end of the pulse of current driven through primary winding 13, a voltage overshoot can be seen on the primary winding. This is indicated at 40 in the pulse pattern shown adjacent winding 13 and is of negative polarity with respect to portion 41 which corresponds to the input pulse. The pulse induced in secondary winding 15 is, therefore, of both positive and negative polarity. The positive portion of this pulse includes a droop or drop-off of current, as indicated in the pulse pattern designated by the numeral 42, which represents energy stored in the transformer. The amount of droop in the non-delayed pulse 42 appearing in output lead 25 is determined by the characteristics of transformer 14 in combination with the value of load resistor 23. As a result, the positive portion 41 of the pulse is induced in the secondary winding and appears on lead 25 as a non-delayed pulse. This positive pulse, however, causes diode 30 to conduct as a short-circuit so that no pulse appears on output lead 35. The negative portion 40 of the pulse is also induced in the secondary winding at the end of the portion 41 and this negative pulse short circuits diode 20 and a positive pulse is delivered to output lead 35 since with the negative pulse, cathode 31 is positive with respect to ground. As a result, the output pulse 43 appearing on lead 35 is delayed with respect to the output pulse on lead 25 by an amount equivalent to the input pulse width and is of the same polarity as the non-delayed output pulse 42.

The amplitude and shape of the delayed output pulse are determined, respectively, by the amount of energy stored in transformer 14 during the time the input pulse is applied and the time constant dictated by the inductance of transformer 14 and resistor 33. Resistor 33 should, therefore, be equal to or less than that required for critical damping to avoid additional overshoots caused by circuit capacity. Although the pulse transformer characteristics in combination with the value of load resistor 23 determines the amount of droop in the non-delayed output pulse waveform on lead 25, proper transformer design combined with appropriate pulse amplification can be made to give no visible droop in the non-delayed output pulse. This can be accomplished by utilizing a normally cut-off pentode amplifier which is overdriven to give plate bottoming.

In Fig. 2 of the drawing, a feature for effectively widening the transformer driving pulse is disclosed. The circuitry of Fig. 2 is the same as that of Fig. 1 with the exception that output lead 25 is connected or buffered back to the input for amplifier 12 by line 45 to provide regenerative action, clipped regeneration being implied. With this arrangement, amplifier 12 remains saturated until the droop in output pulse 52 reaches a predetermined amplitude. At that time, the amplifier 12 switches to its initial condition and the energy stored in transformer 14, as represented by the negative portion 50 of pulse 51, is then induced in the secondary winding 15 and, as in the above-described embodiment, short-circuits diode 20 and provides a positive pulse 53 at the output lead 35. Since the non-delayed pulse is buffered back to amplifier 12, the positive portion 51 of the pulse driven through primary winding 13 is effectively widened and the delayed pulse 53 is, therefore, delayed by an interval greater than the width of the input pulse 11.

The amplitude and shape of pulse 53 at output lead 35 are defined, respectively, by the amount of energy stored in the transformer during the time the amplifier 12 is "on" and by the time constant determined by transformer 14 and load resistor 33. In this instance, load resistor 33 should be equal to or less than that required for critical damping. If resistor 33 is too large, then the circuit will become unstable and generate a continuous train of output pulses. There may be applications, however, in which this may be desirable. Because of the diode switching action in the output, the delayed output is shorted out during pulse amplification, as described in the aforementioned embodiment, and allows better control of amplifier action under varying load conditions.

The following example sets forth the value of various components of the circuit shown in Fig. 2 together with the voltage values appearing on each of output leads 25 and 35. Input pulse 11, 9 volt, positive pulse, 10 microseconds wide; amplifier 12, triode, 1/2 type 5965, dual triode miniature; resistor 23, 250 ohm load; output pulse 52 on lead 25, non-delayed, 13 volt, positive pulse, 15 microseconds wide; output pulse 53 on lead 35, delayed by regeneration 15 microseconds, 11 volt, positive pulse, 20 microseconds wide; resistor 33, 820 ohm load.

The use of positive pulses and tube type amplifier in the above descriptions of Figs. 1 and 2 does not in any way restrict the use of this technique. Vacuum tube, transistor, mechanical, magnetic, etc., amplifiers can be equally well adapted to the circuitry. Positive, negative, or a combination of positive and negative pulse polarities may be used. It will be obvious to those skilled in the art that various changes and modifications may be made without departing from the invention, and the scope of the invention is defined by the appended claim.

Having now particularly described my invention, what I desire to secure by Letters Patent of the United States and what I claim is:

Apparatus for deriving two output pulses from each of a series of single input pulses in which one of said output pulses is delayed with respect to the other output pulse by an interval corresponding at least to the width of the input pulse, comprising in combination an input pulse source, means for amplifying the input pulses derived from said source, a transformer having a primary winding and a secondary winding, said primary winding being connected to said amplifying means and ground and inducing a first pulse of the same polarity as said input pulse and a second pulse of a polarity opposed to that of said input pulse in said secondary winding, a first load circuit including an electronic switching means connected in series circuit with one side of said secondary winding, a resistor connected across said switching means, and an output lead betwen said switching means and said secondary winding, said switching means being nonconductive for applying one of said induced pulses as an output pulse directly to its respective output lead and being rendered conductive by the other of said induced pulses for shorting out its respective resistor, a second load circuit including an electronic switching means connected in series circuit with the other side of said secondary winding and said first-mentioned switching means, a resistor connected across said switching means and an output lead between said switching means and said secondary winding, said switching means being rendered conductive by the one of said induced pulses for shorting out its respective resistor and being non-conductive for applying the other of said induced pulses as an output pulse directly to its respective output lead, said output pulses being of the same polarity as said input pulse with one of said output pulses being delayed with respect to the other and the amplitude and shape of said delayed output pulse being determined by the amount of energy stored in said transformer during the time said input pulse is applied and the time constant of said transformer and the resistor in the load circuit of said delayed output pulse, and means connecting the output lead of said first load circuit to the input lead of said amplifying means for buffering back the undelayed output pulse to provide regenerative action and for effectively increasing the delay of the delayed output pulse.

References Cited in the file of this patent

UNITED STATES PATENTS

| | | |
|---|---|---|
| 1,447,793 | Latour | Mar. 6, 1923 |
| 1,501,569 | Osmos | July 15, 1924 |
| 2,339,466 | Duft | Jan. 18, 1944 |
| 2,529,172 | Moe | Nov. 7, 1950 |
| 2,635,213 | Bruene | Apr. 14, 1953 |
| 2,748,269 | Slutz | May 29, 1956 |
| 2,777,066 | Brockman | Jan. 8, 1957 |
| 2,789,218 | Leonard | Apr. 16, 1957 |

OTHER REFERENCES

Millman and Seely: Second edition 1951, published by McGraw-Hill, page 408, Problem 13–17.

Terman: Radio Engineering, third edition 1947, pages 552 (Fig. 11–5c), 562 (Fig. 11–19), and 523, Fig. D at resonance.